United States Patent [19]

Chen

[11] Patent Number: 5,215,865

[45] Date of Patent: Jun. 1, 1993

[54] IMAGE DEVELOPING METHOD UTILIZING SODIUM SULFIDE AND AMMONIUM POLYSULFIDE DEVELOPER SOLUTION WHEREBY EXPOSED COPPER SUBSTRATE SURFACE CHANGES COLOR

[76] Inventor: Ron-Hon Chen, No. 116, Sze Wei Rd., Taipei, Taiwan

[21] Appl. No.: 758,411

[22] Filed: Aug. 3, 1991

Related U.S. Application Data

[63] Continuation of Ser. No. 441,586, Nov. 27, 1989, abandoned.

[51] Int. Cl.$^5$ .......................... G03F 7/30; G03F 7/32
[52] U.S. Cl. .................................... 430/293; 430/30; 430/145; 430/277; 430/292; 430/294; 430/325; 430/326; 430/331
[58] Field of Search ............... 430/292, 293, 294, 325, 430/326, 331, 30, 145, 277

[56] References Cited

U.S. PATENT DOCUMENTS 3,998,601 12/1976 Yates et al. .......................... 428/339
4,297,435 10/1981 Jolly et al. .......................... 430/292
4,777,111 10/1988 Blumel et al. ...................... 430/326

Primary Examiner—Charles L. Bowers, Jr.
Assistant Examiner—Christopher G. Young
Attorney, Agent, or Firm—Lowe, Price, LeBlanc, & Becker

[57] ABSTRACT

An image development method is disclosed. In the method, a photoresist layer on a metal surface is exposed for development. The developer then used is a solution which will both develop the photoresist image and cause any exposed metal surface to change to a predetermined color. The development process then proceeds until the predetermined color is exposed whereupon the process ceases. The preferred metal is copper and the preferred developer is an aqueous solution of sodium sulphide and ammonium polysulfide.

4 Claims, No Drawings

IMAGE DEVELOPING METHOD UTILIZING SODIUM SULFIDE AND AMMONIUM POLYSULFIDE DEVELOPER SOLUTION WHEREBY EXPOSED COPPER SUBSTRATE SURFACE CHANGES COLOR

This application is a continuation of application Ser. No. 07/441,586 filed Nov. 27, 1989, abandoned.

BACKGROUND OF THE INVENTION:

The present invention relates to an image developing method and the related developer, and, more particularly to the image developing method for indicating developing progress and condition by means of color change of the image on metal base material, to help judging the correct developing time.

In color TV screen and photoresistive printing plate manufacturing and some other precision industries, the process in which light sensitive resin is coated on metal base material for duplicating image through exposure, developing and further etching and electroplating is now commonly applied in manufacturing some component parts.

Theoretically, in ideal developing the light sensitive coating in the area which is not required (nonimage area) is completely removed while the light sensitive coating in the area which is required (image area) is left intact. The light sensitive resins in the image area and nonimage area dissolve at different rates. Therefore, the best developing quality is achieved when the light sensitive resin in the nonimage area is completely dissolved and maximum amount of the light sensitive resin in the image area is maintained. Attempts have been made to solve the problems by adding siliceous sands or silicon dioxide into regular developer solution to increase the dissolving speed difference. However, this method can only slightly improve image enhancement.

When the film of light sensitive resin in the nonimage area is dissolved to an extent of 0.5VM left thereover, the film becomes transparent, and it is impossible to observe the results visually. Even if 0.1VM light sensitive resin is left over, developing quality will be too below. However, the right standard developing time is difficult to judge. Therefore, over developing is commonly used to remove the light sensitive resin from the nonimage area completely, so as to prevent under developing. But during removal of the nonimage area, it is difficult to completely above the nonimage area without the simultaneous removal of image area. Excessive over development will destroy developing quality and cause developing failure. Standard developing time required may vary with the quality, and the thickness of the light sensitive resin coated, the concentration of developing solution, the developing temperature and other factors. In consequence, correct developing is difficult to achieve.

A color indicator image developing method may solve the said problems, in which the developer solution is a developer solution added with or partially replaced by a kind of color change agent which acts to change metal surface color from 0–60 seconds (or the most preferably, from 0–10 seconds) after contact with the metal, or a kind of double-purpose developer solution which reacts to perform image developing process and make metal surface change color immediately (0–10 seconds) after the light sensitive resin in nonimage area is dissolved and the metal surface is exposed in the developer solution. Through color change, the standard developing time is identified. Even if light sensitive resin is partly dissolved due to uneven thickness of coating, the well developed area and the under developing area are obviously indicated through color change indication. Because the contact time of the color change agent and the base metal will affect the color of copper, therefore, resulted and failure resulted from over development or under developing can be eliminated through the present invention since the whole developing process through color change can be observed. Therefore, the standard developing time is instantly indicated. By means of the developing method, a satisfactory quality developing process to a precision image can be easily achieved.

Further, dark dye stuff is normally added to the light sensitive resin. The image area absorbs the dye stuff so as to increase the range of color contrast between the image and the base material. However, the use of dark dye stuff tends to interfere with the sensitivity and the strength of the film. Obvious color convert is presented on the metal surface of the nonimage area and color contrast between the nonimage area and the image area, checking the quality of image developed. Therefore, the present invention can also eliminate the troubles encountered in conventional developing methods which uses dark dye stuff additives.

SUMMARY OF THE INVENTION

The present invention is to provide an image developing method and the related developer for indicating standard developing time according to the color change of the metal base material which is coated with light sensitive resin, wherein the developer used is a regular developer solution added with or partially replaced by a kind of color change agent which acts with metal surface to change color from 0–60 seconds after contact with the metal, or a double-purpose developer solution which reacts to perform image developing process and makes metal surface to change color from 0–60 seconds after the metal surface is in contact with the developer solution.

DESCRIPTION OF THE PREFERRED EMBODIMENTS (1) Example of the present invention:

Mix 35g Sodium Sulfide and 25mg Ammonium Polysulfide with 1000g water to form a solution. Prepare 4 pieces 10x 10cm test boards with degreasing, surface cleaning, washing and drying process. Coat two pieces of test boards with AZ1350 Positive Working Photo Resist and baked at 80'C for 15 minutes. Then, a positive film with lines in 1mm width is superimposed on the test boards at equal interval 2mm, and exposed under a 1KW ultraviolet lamp at a distance of 90cm for 90 seconds. AZ 1350 is a conventional positive photoresist marketed by Shipley Company, Inc., 2300 Washington Street, Newton, MA 02162.

Dip one piece of test board (without light sensitive coating) into the prepared developer solution to see the color change of the copper surface. The copper surface of the test board immediately changes into orange, then into yellow and yellow green in sequence rapidly. 10 seconds thereafter, the color becomes deep green and later, darker. 20 seconds thereafter, the color changes through light black to dark black.

Dip into the solution a piece of the test board after exposure, and gently shake the solution. The light sensitive layer (Positive Working Photo Resist) in nonimage area is gradually dissolved and becomes visible. 20 seconds thereafter, the light sensitive layer in nonimage area is almost disappeared and image is clear now, but the color in this nonimage area still remains unchanged. This means, very thin sensitive layer which can not be observed through visual sensations is still existing in this nonimage area. 38 seconds thereafter, color of some portion of the nonimage area starts to change into, which indicated that this portion is just well developed while the other area is still not well developed yet due to uneven thickness of coating. 50 seconds thereafter, the whole nonimage area is completely changed through orange into black color. Because the solution makes the copper surface change color immediately after contact, the best developing result is achieved when color of the nonimage area is changing from orange into black. If keep on developing, the copper surface will change color from deep green, light black finally into black. The variation of color change indicates the degree of image developing.

Therefore, image developing stage and result can be obviously observed through color change, that is color of sensitive coating on copper surface→color of copper surface→orange→yellow green→deep green →light black→black. After image developed, the line of the color between deep green to black in the nonimage area is prominent from the line of light red color in the image area (because the AZ1350 contains red dye stuff). This color contrast is very helpful for further verification process.

If the test board is kept dipping in the solution, 3 minutes and 42 seconds thereafter color of some image area is getting changed which indicates image area is destroyed. From 58 seconds to 3 minutes and 42 seconds, there is only a tolerance of 2 minutes and 44 seconds. This indicates that the difference of solubility between the image area and the nonimage area is only a small range.

(2) Example of the prior art (regular image developing method):

Mix 30g Sodium Metasilicate and 30g Sodium Phosphide in 1000g water to prepare a developer solution similar to regular commercial developer solution.

Dip an exposed test board into the prepared developer solution and gently shake the solution. The light sensitive coating (Positive Working Photo Resist) in the nonimage area will be dissolved gradually and the copper surface will become observable visually. If development is stopped it is still incomplete because one can not observe through naked eyes when little amounts of light sensitive coating is left over the nonimage area. Therefore, an experienced user normally stops developing during over developing stage to prevent any possobility in which residue or light sensitive coating is still left over the nonimage area. If lacking in experience, a user may constantly make erroneous judgments. In consequence, or failure may happen due to under-development or over-development.

The following is a comparative table made between the example of the present invention and the example of the prior art:

| method | condition | | | | | |
| --- | --- | --- | --- | --- | --- | --- |
| | Under development | Over development | Partial area is developed | Standard developing time | Contrast between image/nonimage areas | Developing stage |
| Conventional method | x | x–Δ | x | x | x–○ | x |
| Present indicator developing method | ○ | ○ | ○ | ○ | ○ | ○ |

Remarks:
x: not indicatable or indication not definite
Δ: Roughly indicatable
○: Clearly indicated

I claim:
1. An image development method comprising the steps of:
   providing a photoresist with an image exposed thereon, layered on a copper surface having a normal first color;
   providing a developer solution which will react with the resist to develop the image thereon and which will cause any exposed metal surface therebeneath to change to a second contrasting color said solution containing sodium sulfide and ammonium polysulfide; and
   developing said resist with said solution only until copper surface portions in the non-image areas exhibit said second color.
2. The method of claim 3 wherein the second color is black.
3. The method of claim 2 wherein said developer solution comprises in parts by weight 36 parts sodium sulfide and 25 parts ammonium polysulfide in 1000 parts water.
4. The methdo of claim 1 wherein said developer solution reacts with the resist to develop the image for up to sixth seconds.

* * * * *